United States Patent [19]
Tanaka et al.

[11] Patent Number: 5,179,615
[45] Date of Patent: Jan. 12, 1993

[54] OPTICAL WAVEGUIDE HAVING A VARIABLE REFRACTIVE INDEX AND AN OPTICAL LASER HAVING SUCH AN OPTICAL WAVEGUIDE

[75] Inventors: Kazuhiro Tanaka; Kiyohide Wakao, both of Kawasaki, Japan

[73] Assignee: Fujitsu Limited, Kawasaki, Japan

[21] Appl. No.: 854,707

[22] Filed: Mar. 20, 1992

[30] Foreign Application Priority Data

Mar. 20, 1991 [JP] Japan .................... 3-57426

[51] Int. Cl.⁵ .................. G02B 6/10; H01S 3/30; H01L 27/12
[52] U.S. Cl. ...................... 385/131; 385/14; 385/132; 372/7; 372/44; 372/45; 372/46; 257/9; 257/12; 257/13
[58] Field of Search ............... 385/2, 14, 122, 131, 385/132, 141; 372/7, 43, 44, 45, 46, 50; 357/4, 16, 17, 18, 19, 30, 71

[56] References Cited

U.S. PATENT DOCUMENTS

| | | | |
|---|---|---|---|
| 4,746,181 | 5/1988 | Hayakawa et al. | 385/131 X |
| 4,752,934 | 6/1988 | Fukuzawa et al. | 372/46 |
| 4,755,015 | 7/1988 | Uno et al. | 385/131 X |
| 4,794,611 | 12/1988 | Hara et al. | 372/45 |
| 4,840,446 | 6/1989 | Nakamura et al. | 385/131 X |
| 5,091,756 | 2/1992 | Iga et al. | 357/4 |
| 5,105,240 | 4/1992 | Omura | 357/4 |
| 5,107,306 | 4/1992 | Blood et al. | 357/4 |
| 5,107,514 | 4/1992 | Goto | 372/45 |
| 5,111,255 | 5/1992 | Kiely et al. | 372/45 X |
| 5,124,996 | 6/1992 | Ikeda | 372/45 |

FOREIGN PATENT DOCUMENTS 3-235915 10/1991 Japan .................... 385/131 X

*Primary Examiner*—Brian Healy
*Attorney, Agent, or Firm*—Staas & Halsey

[57] ABSTRACT

A semiconductor optical waveguide comprises a substrate of a semiconductor material doped to a first conductivity type, a multiple quantum well layer provided on the substrate for guiding an optical beam, a clad layer doped to a second conductivity type and provided on the multiple quantum well layer for confining the optical beam, a first electrode provided on the upper major surface of the clad layer for injecting carriers of a first type into the quantum well layer, and a second electrode provided on the lower major surface of the substrate for injecting carriers of a second type into the quantum well layer, wherein multiple quantum well layer comprises an alternate stacking of: a quantum well layer having a composition set to provide a smallest band gap that is possible under a constraint that the quantum well layer maintains a lattice constant with the substrate and a thickness set with respect to the optical energy of the optical beam such that a discrete quantum level of carriers is formed in the quantum well layer at an energy level larger than the optical energy by about 50 meV; and a barrier layer having a band gap substantially larger than the band gap of the quantum well layer.

12 Claims, 11 Drawing Sheets

OPTICAL WAVEGUIDE HAVING A VARIABLE REFRACTIVE INDEX AND AN OPTICAL LASER HAVING SUCH AN OPTICAL WAVEGUIDE

BACKGROUND OF THE INVENTION

The present invention generally relates to optical devices for use in optical telecommunications and more particularly to an optical waveguide that has a variable refractive index.

In the optical telecommunication systems, the control of refractive index of various optical elements is a key technique. For example, one can switch the path of optical signals by changing the refractive index of the optical waveguide. By using an optical waveguide capable of changing the refractive index for the laser diodes, on the other hand, one can modify the effective resonant optical length of the laser diode and hence the oscillation wavelength. Further, the optical waveguide having the variable refractive index can be used, in combination with a laser diode, to construct an optically bistable laser diode. Such an optically bistable laser diode is an essential device for constructing a digital optical processing system.

In the semiconductor waveguides, the refractive index can be changed either by applying a control voltage or by injecting a control current. When a control voltage is applied, an electric field is induced in the semiconductor waveguide and such an electric field in turn causes the desired refractive index change by inducing the Franz-Keldysh effect or Quantum Confinement Stark effect. Generally, the change of the refractive index achieved by such an electric field effect is small and one needs a large control voltage to achieve a necessary refractive index change.

The injection of carriers, on the other hand, provides a large refractive index change by causing the band filling effect or plasma effect, and is expected to become an important as sell as fundamental process for controlling the tunable laser diodes or tunable filters in the wavelength multiplex optical networks or for constructing the optical switches that switches the path of the optical beam. In these applications, it is essential to have a large refractive index change with a small injection current.

FIG. 1(A) sows the refractive index change profile achieved in a bulk semiconductor material, wherein the horizontal axis represents an energy E while the quantity $\rho$ on the vertical axis represents the density of state of the carriers. As is well known, the density of state $\rho$ changes parabolically with the energy E in the bulk crystal, and the carriers fill the states starting from the bottom edge of the hand in accordance with the Fermi-Dirac distribution function as shown by the shaded area of FIG. 1(A). In FIG. 1(A), the shaded area represents the states filled by the electrons. In response to the filling of the electrons, there appears a profile of refractive index $\Delta n$ as plotted also in FIG. 1(A). As will be understood from the description below, the refractive index profile $\Delta n$ includes the contributions of the electrons that are distributed over a wide energy spectrum in correspondence to the shaded area, and the magnitude of $\Delta n$ becomes inevitably small as a result of broadening caused by these contributions.

FIG. 1(B) shows the density of state that is achieved in the quantum structure wherein the carriers are confined three-dimensionally in a minute region or a quantum well box. In such a case, the density of state $\rho$ is represented approximately by the Dirac's $\delta$-function as illustrated, and one obtains a corresponding distribution of the refractive index $\Delta n$ according to the Kramers-Kronig relation, which describes a correspondence between the real part and the imaginary part of a physical quantity based upon the causality, as illustrated also in FIG. 1(B).

In FIG. 1(B), it should be noted that the curve $\Delta n$ represents the contribution from the $\delta$-function-like state density $\rho$ located at the energy $E_O$ and has a magnitude much larger than the magnitude of the refractive index change achieved in the bulk crystal. It should be noted further that the curve $\Delta n$ of FIG. 1(A) is obtained as a result of the superposition of the curve $\Delta n$ of FIG. 1(B) for the carriers of different energies. Thereby, the refractive index change $\Delta n$ becomes substantially broad and small in the bulk crystal as a result of the superposition.

In view point of realizing a large refractive index change in the semiconductor waveguides, it is advantageous to device a structure that shows the density of state similar to FIG. 1(B). For this purpose, the inventors of the present invention have previously proposed, in the Japanese Laid-open Patent Application 3-235915 published on Oct. 21, 1991, the use of a multiple quantum well (MQW) structure for the semiconductor waveguide.

FIG. 2(A) shows the band structure of the MQW waveguide proposed in the foregoing prior art.

Referring to FIG. 2(A), the MQW waveguide is formed as an alternate deposition of a quantum well layer 1 and a barrier layer 2 wherein the barrier layer 2 has a band gap much larger than the band gap of the quantum well layer. Thereby, the barrier layer 2 acts as a potential barrier and confines the carriers vertically into the quantum well layer 1 formed between the barrier layers 2.

In such a MQW structure, it is well known that discrete quantum levels $Ec_1$ and $Ev_1$ appear in the conduction band $E_c$ and the valence band $E_v$ when the thickness $L_w$ of the quantum well layer 1 is decreased approximately below the de Broglie wavelength of the carriers. With further decrease in the thickness $L_w$, the quantum levels $Ec_1$ and $Ev_1$ increase as indicated by arrows, resulting in an increased energetical separation $E_1$ between the quantum level $Ec_1$ and the quantum level $Ev_1$.

FIG. 2(B) shows the density of state for the MQW structure of FIG. 2(A). Generally, the density of state for this case is represented by a step-like pattern, wherein the step pattern designated as $\rho_1$ corresponds to the case where the thickness $L_w$ is set at a first value $L_1$, the step pattern designated as $\rho_2$ corresponds to the case where the thickness $L_w$ is set at a second value $L_2$, and the step pattern designated as $\rho_3$ corresponds to the case where the thickness $L_w$ is set at a third value $L_3$. It will be noted that the step height increases significantly with decreasing thickness $L_w$ of the quantum well layer 3 as a result of the significant increase in the number of available quantum states, which in turn is caused as a result of the shift of the quantum level in the higher energy side.

Similarly to the case of the bulk crystal shown in FIG. 1(A). It will be noted that the carriers fill the quantum sates starting from the bottom edge of the step in accordance with the Fermi-Dirac distribution function. Thereby, the carriers distribute in the quantum level as represented in FIG. 2(B) by the shading.

In the diagram of FIG. 2(B), it should be noted that the number of carriers that occupy the quantum level remains constant even when the thickness $L_w$ of the quantum well layer 1 is increased from $L_1$ to $L_3$. Thereby, the shaded area remains constant in the case where $L_w$ is set equal to $L_1$ and in the case where $L_w$ is set equal to $L_3$. This means that the range of the energy levels that the carriers occupy is substantially reduced by decreasing the thickness $L_w$, and the density of state approaches to the $\delta$-function-like pattern shown in FIG. 1(B). Thereby, one can increase the magnitude of the refractive index change $\Delta n$.

As the profile of the refractive index change $\Delta n$ disappears when there is no carrier in the quantum levels $Ec_1$ and $Ev_1$, one can control the refractive index of the quantum well layer 1 by injecting or removing the carriers. Thus, the optical waveguide of this prior art is suitable for maximizing the range of change of the refractive index.

In this conventional approach, however, there exists a problem in that there is formed a band tail at the bottom edge of the step as shown in FIG. 3 in the real MQW structure due to the scattering of the carriers by the impurities or phonons. There, the band tail extends in the lower energy side typically by 50±15 meV from the energy $E_1$ that corresponds to the lower edge of the ideal optical absorption band. It should be noted that the density of state shown in FIG. 2(B) is for the ideal case where the effect of such scattering is not considered. As the band tail is formed at the bottom edge of the band, the carriers inevitably occupy the states corresponding to the band tail part and these carriers cause an absorption of the optical beam whenever the optical beam is supplied to the waveguide with the wavelength corresponding to the band tail. When the wavelength of the input optical beam is determined by the requirement of the optical transmission path etc., it is necessary to construct the MQW waveguide such that the unwanted absorption of the optical beam by the band tail does not occur while maintaining a maximum refractive index change.

SUMMARY OF THE INVENTION

Accordingly, it is a general object of the present invention is to provide a novel and useful semiconductor optical waveguide, wherein the foregoing problems are eliminated.

Another and more specific object of the present invention is to provide a semiconductor optical waveguide capable of changing a refractive index in response to an injection of carriers, wherein a maximum refractive index change is achieved while minimizing an optical absorption simultaneously.

Another object of the present invention is to provide a semiconductor optical waveguide for guiding an input optical wave having a predetermined optical energy, said semiconductor optical waveguide having an MQW structure provided on a single crystal substrate, said MQW structure including a quantum well layer with a composition set to provide a smallest band gap possible under a constraint that the quantum well layer establishes a lattice matching with the substrate, and wherein the quantum well layer has a thickness set such that a discrete quantum level formed in the quantum well layer has an energy higher by at least 50 meV than the predetermined optical energy of the input optical beam.

According to the present invention, one can maximize the refractive index while avoiding the absorption of the input optical beam caused by the band tail. More specifically, one can increase the change of the refractive index of the MQW waveguide by decreasing the thickness of the quantum well layer according to the principle explained with reference to FIG. 2(B). On the other hand, the MQW waveguide has to be tuned to the wavelength of the input optical beam by setting the composition such that the large refractive index change occurs in correspondence to the predetermined wavelength of the input optical beam. It should be noted that such a change of the thickness of the quantum well layer causes an unwanted shift of the quantum level $Ec_1$ and hence a de-tuning of the wavelength at which the waveguide shows the large refractive index change. In the present invention, such a shift of the wavelength is compensated by adjusting the composition of the quantum well layer. There, the composition of the quantum well layer is set to a limiting composition that can be achieved while maintaining a satisfactory lattice matching with the substrate, such that the quantum well layer shows a smallest band gap and hence a largest band gap wavelength. Further, by setting the thickness of the quantum well layer in correspondence to the wavelength of the input optical beam such that the quantum level provides a wavelength that is higher than the wavelength of the input optical beam by about 50 meV, one can avoid the unwanted absorption of the input optical beam by the band tail.

DETAILED DESCRIPTION OF THE PREFERRED EMBODIMENTS

Figure 4:
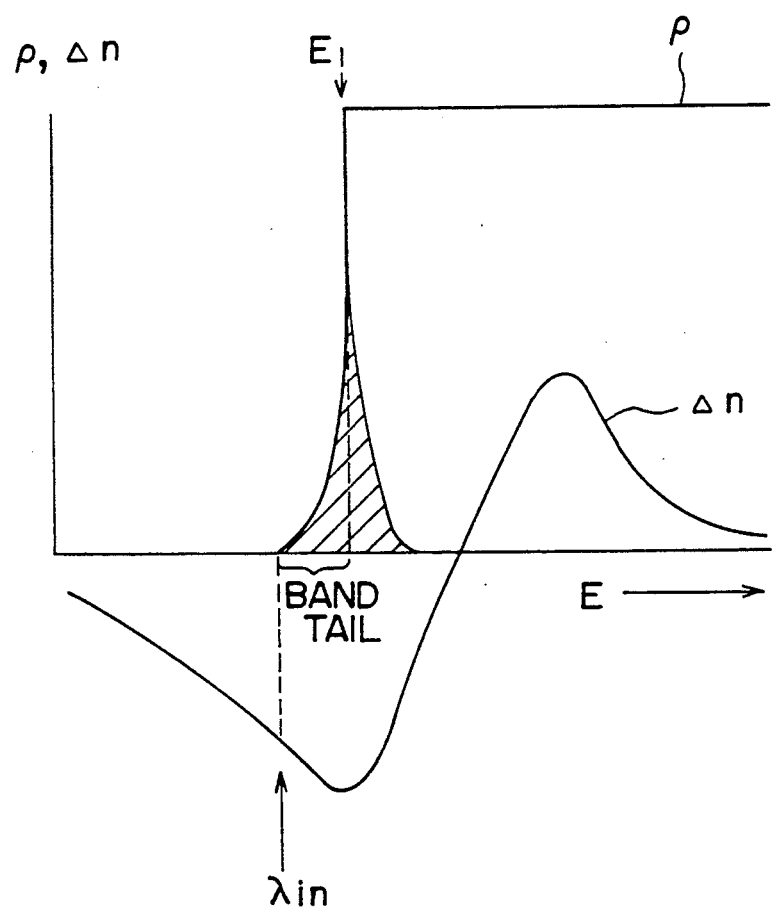
FIG. 4 is a diagram showing the principle of the present invention.

First, the principle of the present invention will be explained with reference to FIG. 4 showing the density of state and corresponding refraction index change profile realized in an optimized MQW structure. Similarly to the foregoing diagrams, the shaded area of FIG. 4 represents the quantum states that are occupied by the carriers.

Referring to the drawing, the optimized MQW waveguide is formed in correspondence to the wavelength $\lambda_{in}$ of the input optical beam such that the wavelength $\lambda_{in}$ misses the band tail. More specifically, the thickness of the quantum well layer of the MQW is set as small as possible to realize the large change of the refractive index as explained with reference to FIG. 2(B). Further, the composition of the quantum well layer is adjusted such that a maximum refractive index change is obtained at the wavelength $\lambda_{in}$ of the input optical beam. Furthermore, the thickness of the quantum well layer is adjusted such that the wavelength $\lambda_{in}$ of the input optical beam does not fall in the range wherein the MQW waveguide shows the absorption. In other words, the foregoing optimization of the MQW waveguide includes the steps of: optimizing the composition of the quantum well layer; and optimizing the thickness of the quantum well layer in relation to the wavelength of the input optical beam and further in relation with the composition of the quantum well layer.

It should be noted that the reduction of the thickness of the quantum well layer causes a shift of the quantum level and hence the shift of the profile of the refractive index change in the higher energy side, simultaneously to the increase in the magnitude of the refractive index change. This inevitably causes a relative shift of the wavelength $\lambda_{in}$ of the input optical beam away from the band edge of the wavelength in which the MQW waveguide shows the large refractive index change. In other words, there occurs a de-tuning of the MQW waveguide. Thus, in order to maintain the wavelength $\lambda_{in}$ to be located at the lower edge of the band tail as shown in FIG. 4, it is necessary to change the composition of the quantum well layer simultaneously to the change of the thickness of the quantum wall layer. The wavelength $\lambda_{in}$ coincident to the lower edge of the band tail is the optimum wavelength of the input optical beam, as the optical beam with the wavelength shorter than this wavelength experiences the absorption by the carriers in the band tail, while the optical beam with the wavelength longer than this wavelength experiences a reduced change of the refractive index.

Figure 5:
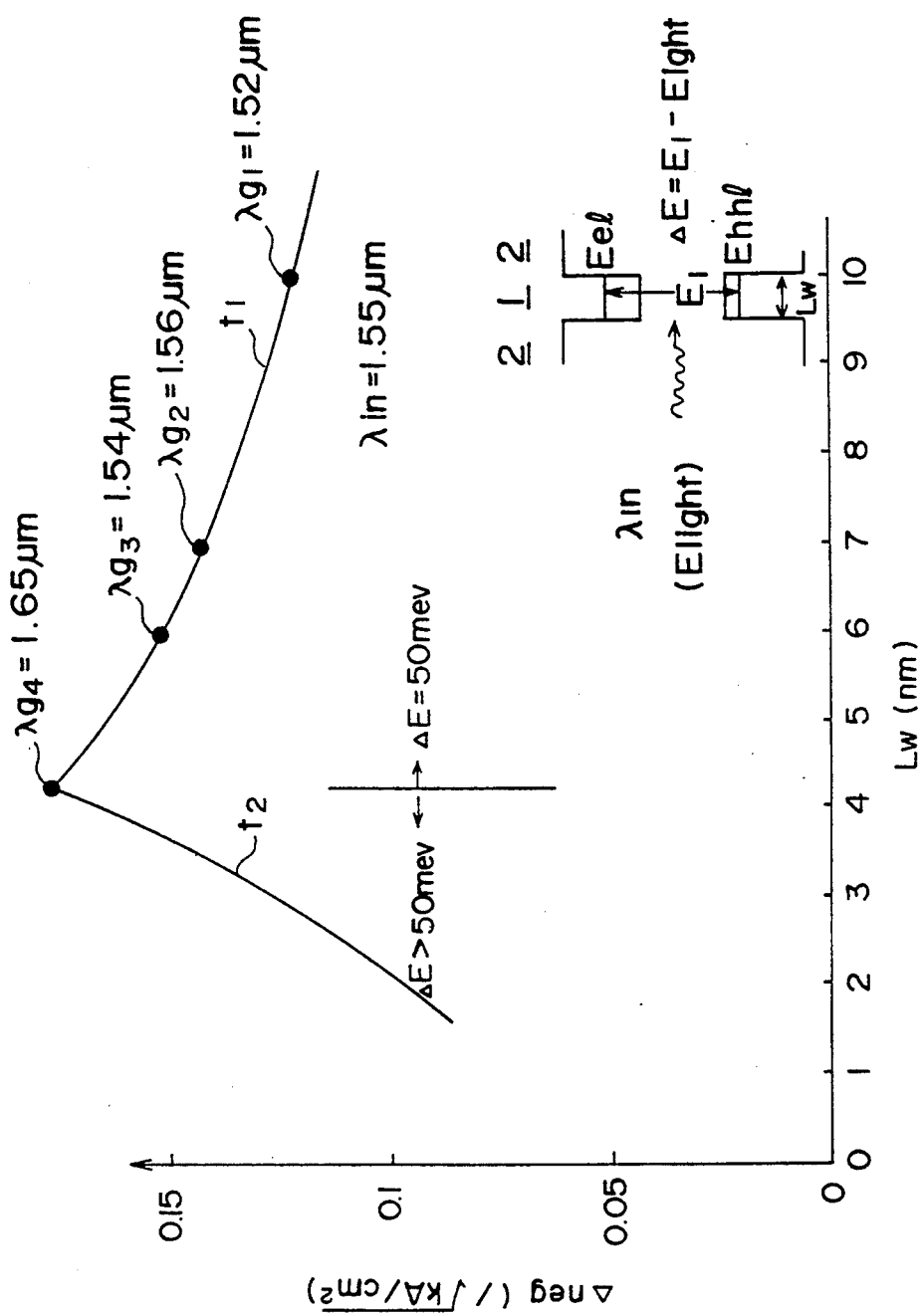
FIG. 5 is a diagram for explaining the principal construction of the MQW waveguide of the present invention.

Hereinafter, the principle of the foregoing optimization will be described with reference to FIG. 5, wherein the FIG. 5 shows the relationship between the refractive index change achieved in the MQW waveguide as a result of injection of the carriers and the thickness of the quantum well layer of the MQW waveguide.

Figure 1A:
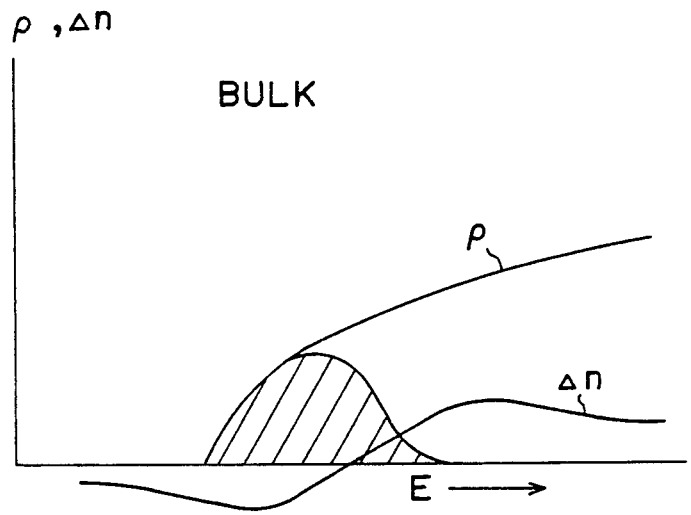
FIGS. 1(A) and 1(B) are diagrams showing the density of state and a corresponding profile of the refractive index change for a bulk crystal and for a three-dimensional quantum well box respectively.
Figure 1B:
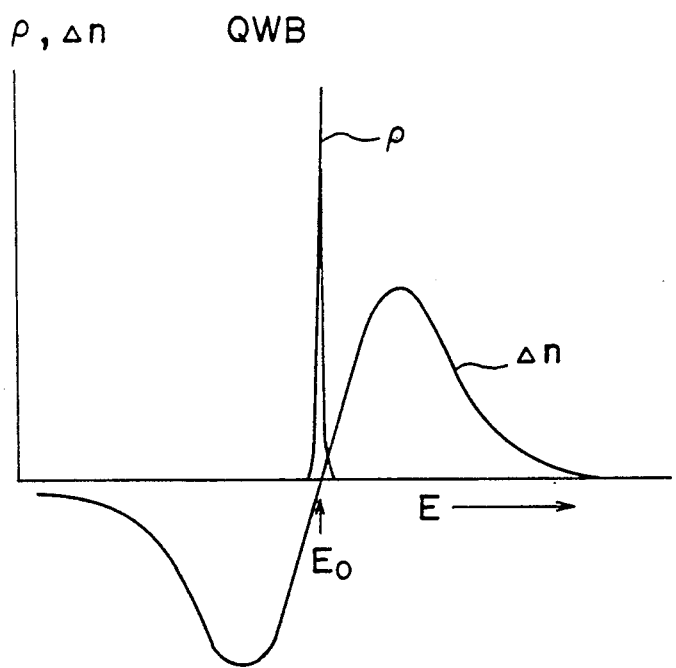
Figure 2A:
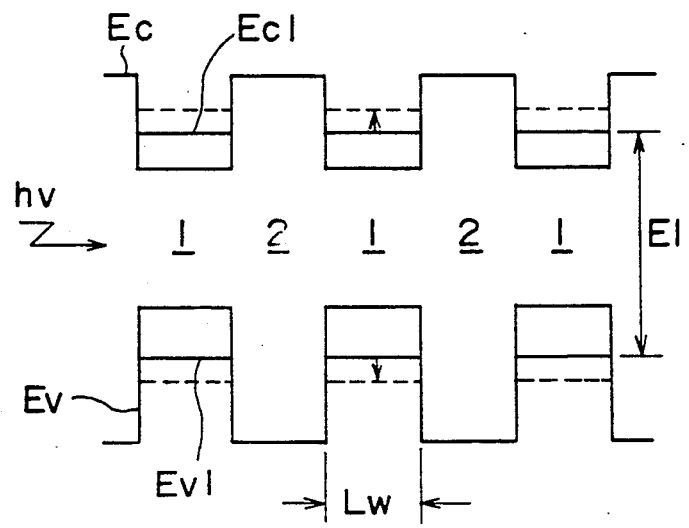
FIGS. 2(A) and 2(B) are diagrams showing the band structure and the density of state for a MQW waveguide structure proposed previously.

The MQW waveguide under consideration is designed to guide an optical beam having a wavelength of 1.55 μm, and includes a quantum well layer of InGaAsP and a barrier layer also of InGaAsP, wherein the quantum well layer has a thickness of 4–10 nm and a composition in correspondence to the bandgap wavelength of 1.52 μm–1.65 μm. On the other hand, the barrier layer has a composition corresponding to the bandgap wavelength of 1.15 μm and a thickness of 10 nm. Thereby, a quantum well structure is formed in the MQW waveguide with the band diagram shown at the lower right corner of FIG. 5. As usual in the band structure of MQW, the quantum well layer is characterized by a quantum level $E_{el}$ for the electrons and a quantum level $E_{hhl}$ for the heavy holes, wherein the quantum level $E_{el}$ and the quantum level $E_{hhl}$ are separated from each other by an energy $E_1$ corresponding to the energy $E_1$ of FIG. 2(A).

It should be noted that the curve $t_1$ shown in FIG. 5 represents the change of the refractive index achieved in the quantum well layer in response to the injection of the carriers into the quantum states, for various thicknesses $L_w$ of the quantum well layer. As the energy of the quantum levels $E_{el}$ and $E_{hhl}$ shifts in response to the thickness $L_w$ of the quantum well layer, it is necessary to change the composition of the quantum well layer in correspondence to the thickness $L_w$ in order to maintain the relationship shown in FIG. 4. Thus, when the thickness of the quantum well layer 1 is set to 10 nm, the composition of the layer 1 is set to $In_{0.59}Ga_{0.41}As_{0.87}P_{0.13}$ for providing the bandgap wavelength $\lambda g_1$ of 1.52 μm. It should be noted that, in the MQW waveguide grown on a substrate such as InP, the foregoing composition of the quantum well layer 1 has to be chosen also to satisfy the requirement of lattice matching with the substrate. At the foregoing composition, the layer 1 has the lattice constant of 5.862 Å, while InP has a lattice constant of 5.869 Å. Generally, the deviation of the lattice constant of about 0.1% is allowed, while when the deviation exceeds the foregoing limit, the epitaxial growth of the quantum well layer 1 is no longer possible.

By setting the thickness and composition of the layer 1 as such, one can obtain the energy gap $E_1$ that is higher by 50 meV than the optical energy of the input optical beam corresponding to the wavelength $\lambda_{in}$ of 1.55 μm. In other words, the foregoing composition and thickness of the quantum well layer 1 satisfies the relationship shown in FIG. 4. In terms of the quantity $\Delta E$ defined in the band diagram shown at the lower right corner of FIG. 5, the foregoing thickness and composition of the quantum well layer 1 satisfies the relationship $\Delta E \approx 50$ meV.

When the thickness of the quantum well layer 1 is reduced further for increasing the magnitude of change of the refractive index $\Delta n$, the composition of the layer 1 has to be changed accordingly, and the refractive index changes along the line $t_1$. Thus, when the thickness $L_w$ is set to 7 nm, the composition of the quantum well layer 1 is set to $In_{0.58}Ga_{0.42}As_{0.91}P_{0.09}$ in correspondence to the bandgap wavelength $\lambda g_2$ of 1.56 μm. When the thickness $L_w$ is reduced further to 6 nm, the composition of the layer 1 is set to $In_{0.59}Ga_{0.41}As_{0.89}P_{0.11}$ in correspondence to the bandgap wavelength $\lambda g_3$ of 1.54 μm. Of course, these compositions are chosen to satisfy the requirement of the lattice matching, in addition to the foregoing condition of $\Delta E \approx 50$ meV.

Figure 2B:
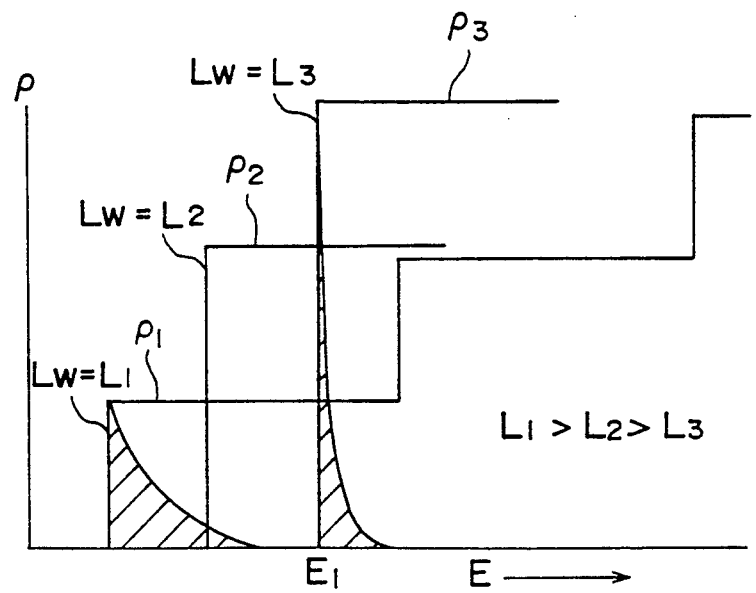
Figure 3:
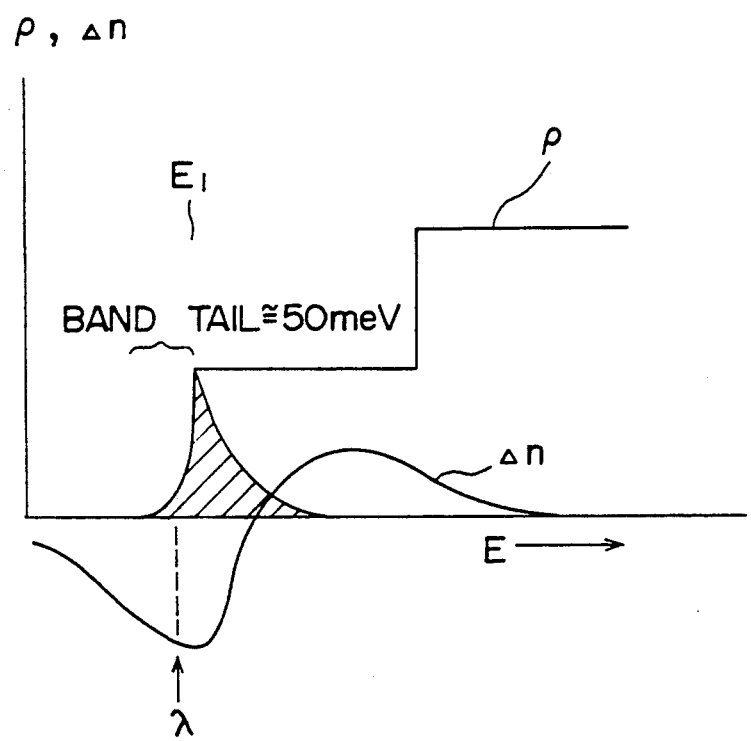
FIG. 3 is a diagram showing the problem pertinent to the prior art MQW waveguide of FIG. 2(A)

According to the principle described with reference to FIG. 2(B), the refractive index change $\Delta n$ increases along the curve $t_1$ with decreasing thickness of the quantum well layer $L_w$. When the thickness $L_w$ is reduced below about 4.2 nm, on the other hand, there is no composition of InGaAsP that satisfies the relationship of FIG. 4 and simultaneously the requirement of lattice matching. In other words, the InGaAsP quantum well layer that satisfies the relationship of FIG. 4 and simultaneously has the thickness of $L_w$ of less than about 4.2 nm cannot be grown epitaxially on the InP substrate. This limiting composition is given as $In_{0.53}Ga_{0.47}As$ and provides the bandgap wavelength $\lambda_{g4}$ of 1.65 μm. The lattice constant of this material is 5.862 Å.

When the thickness $L_w$ of the quantum well layer is reduced below the foregoing value of 4.2 nm, the condition $\Delta E \approx 50$ meV is not held anymore. In other words, the relationship of FIG. 4 is lost and the magnitude $\Delta n$ of the refractive index decreases along the curve $t_2$ with decreasing thickness $L_w$. This decrease of $\Delta n$ corresponds to the increased offset of the wavelength $\lambda_{in}$ from the lower edge of the band in FIG. 4.

From the foregoing explanation, it will be understood that there exists an optimized composition and thickness for the quantum well layer of a MQW waveguide, wherein the optimized composition and thickness are determined with reference to the wavelength of the optical beam to be guided by the MQW waveguide and the lattice constant of the substrate. In the aforementioned example, one can obtain a refractive index change $\Delta n$ as large as 0.2 by injecting the carriers with a current injection of 1 kA/cm² into the quantum levels formed in the quantum well layer 1.

Next, a first embodiment of the present invention will be described with reference to a tunable laser diode that uses the MQW waveguide described above with reference to FIG. 6.

Figure 6:
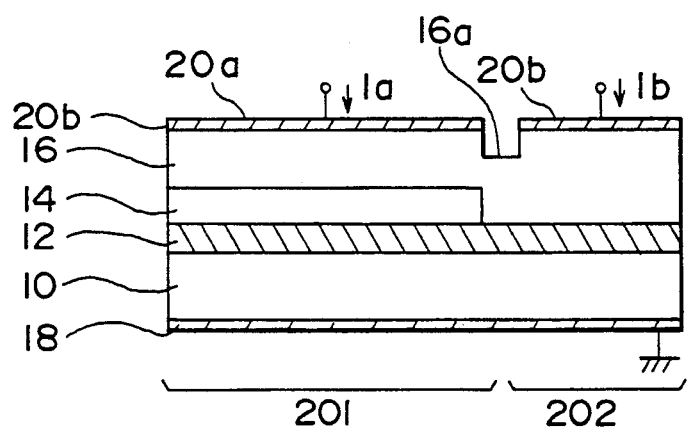
FIG. 6 is a diagram showing the structure of a tunable laser diode that uses the MQW waveguide according to a first embodiment of the present invention.

Referring to FIG. 6, the tunable laser diode includes a substrate 10 of n-type InP, and an MQW waveguide layer 12 is provided on the substrate 10. The waveguide layer 12 has the construction and band structure explained with reference to FIG. 5 and includes the InGaAs quantum well layer 1 sandwiched vertically by a pair of barrier layers 2 of InGaAsP. As already noted, the quantum well layer 1 has the optimized composition of $In_{0.53}Ga_{0.47}As$ and the optimized thickness of 4.2 nm. The barrier layer 2 on the other hand has the composition of $In_{0.81}Ga_{0.19}As_{0.4}P_{0.6}$ in correspondence to the bandgap wavelength $\lambda_g$ of 1.15 μm and a thickness of 10 nm. Of course, the quantum well layer 1 and the barrier layer 2 of the foregoing compositions establish a lattice matching with the InP substrate 10. Typically, the layers 1 and 2 are repeated 20 times to form the MQW waveguide layer 12, wherein the total thickness of the layer 12 becomes about 0.3 μm.

On the waveguide layer 12, an active layer 14 of InGaAsP having a composition set to have a bandgap wavelength $\lambda_g$ of 1.55 μm is grown to form an active region 201, wherein the active layer 14 extends for a limited length of the waveguide layer 12. The part of the waveguide layer 12 that is not provided with the active layer 14 forms a phase adjusting region 202. Further, a clad layer 16 of p-type InP is grown on the active layer 14 and an electrode 20a is provided on the upper major surface of the clad layer 16 in correspondence to the active region 201.

The clad layer 16 is further provided with another electrode 20b on the upper major surface in correspondence to the phase adjusting region 202, wherein the electrode 20b is separated from the electrode 20a by a groove 16a. Further another electrode 18 is provided on the entire lower major surface of the substrate 18.

In operation, the electrode 18 is connected to the ground and a driving current $I_a$ is injected to the active layer 14 via the electrode 20a. In response to the injection of the driving current $I_a$, a stimulated emission of photons occurs in the active layer 14 as usual. The light thus produced is then guided along the MQW waveguide layer 12 as an optical beam, and the optical beam is reflected back and forth between the mirror surfaces formed at both longitudinal ends of the waveguide layer 12. The optical beam thus guided along the waveguide 12 facilitates the stimulated emission in the active layer 14, and the laser oscillation is established thereby in the active layer with the wavelength that is determined by the resonant optical length of the MQW waveguide layer 12.

In the present invention, one can control the resonant length and hence the oscillation wavelength of the laser diode by injecting a control current $I_b$ into the MQW waveguide 12 in correspondence to the phase shift region 202 via the electrode 20b. It should be noted the resonant length of the MQW waveguide 12 is determined by a physical length of the layer 12 multiplied by the refractive index. By injecting the control current $I_b$ into the waveguide 12 in correspondence to the phase adjusting region 202 independently from the bias current $I_a$, one can fill the quantum states of the quantum well layer 1 in the MQW waveguide 12 as shown by the shaded area in FIG. 4. Thereby, a large change of the refractive index is achieved as already explained. Thus, by controlling the current $I_b$, one can control the refractive index of the region 202 and hence the oscillation wavelength of the laser diode. This device can also be operated as a tunable laser amplifier by controlling the drive current $I_a$ below the threshold level of laser oscillation. As the tuning operation of the laser diode having the general construction of FIG. 6 is well known, further description will be omitted.

Figure 7:
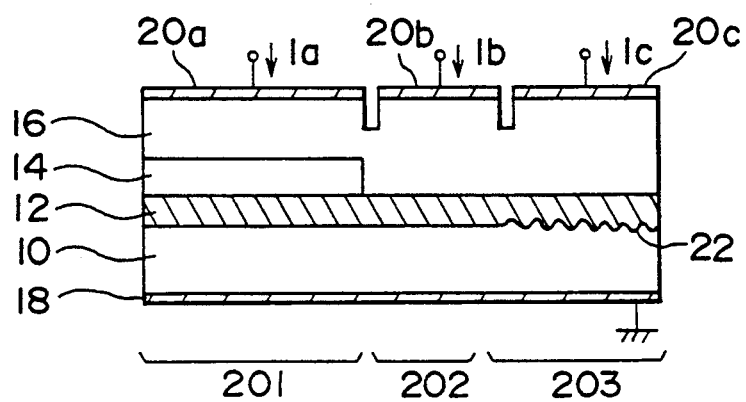
FIG. 7 is a diagram showing the structure of another tunable laser diode that uses the MQW waveguide according to a second embodiment of the present invention.

FIG. 7 shows another example of the tunable laser diode according to a second embodiment. In this embodiment, too, the device is constructed on the n-type InP substrate 18 and the MQW waveguide layer 12 is provided on the substrate 18 to extend from a first longitudinal end to a second, opposing longitudinal end. Similarly to the device of FIG. 6, the electrode 18 covers the entire lower major surface of the substrate 18.

Referring to FIG. 7, the device of the present invention is divided into three parts along the longitudinal direction, i.e., the active region 201 corresponding to the active region of FIG. 6 and provided with the active layer 14 thereon, the phase adjusting region 202 corresponding to the phase adjusting region of FIG. 6, and a DBR region 203 wherein a corrugation grating 22 is provided. The p-type InP clad layer 16 grown on the active layer 14 similarly to the embodiment of FIG. 6, and the electrodes 20a and 20b are provided on the upper major surface of the clad layer 16 respectively in correspondence to the active region 201 and the phase adjusting region 202. Further, another electrode 20c is provided on the clad layer 16 in correspondence to the DBR region 203. In the device of the present invention, another control current $I_c$ is injected to the MQW waveguide 12 in correspondence to the DBR region 203, and the oscillation wavelength of the laser diode is controlled by controlling the currents $I_b$ and $I_c$ while simultaneously sustaining the laser oscillation by the drive current $I_a$.

Figure 8:
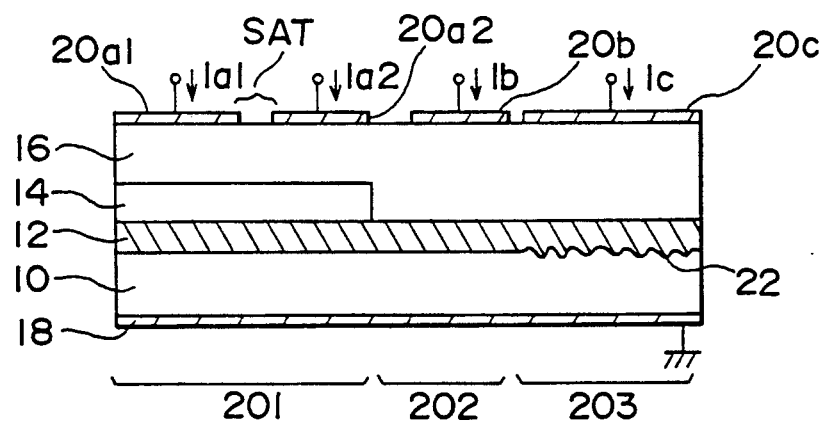
FIG. 8 is a diagram showing the structure of an optical bistable laser diode that uses the MQW waveguide according to a third embodiment of the present invention.

FIG. 8 shows a bistable laser diode according to a third embodiment of the present invention. It should be noted that the device of the present embodiment can be derived from the structure of FIG. 7 by dividing the electrode 20a into a first part $20a_1$ and a second part $20a_2$ with a gap region SAT that acts as a saturable absorption region.

Because of the existence of the saturable absorption region SAT that absorbs the optical radiation, the laser diode does not start oscillation spontaneously even when biased by supplying drive currents $Ia_1$ and $Ia_2$ respectively to the electrodes $20a_1$ and $20a_2$ with a level exceeding the threshold level, unless there is supplied an optical trigger to the active layer 14. In response to the optical trigger, the optical absorption in the region SAT is saturated and the region SAT becomes transparent. Thereby, the laser oscillation starts.

By employing the MQW waveguide 12 in combination with such an optical bistable laser diode, one can change the oscillation wavelength in response to the control currents $I_b$ and $I_c$ similarly to the device of FIG. 7. Thereby, the optical bistable device of the present embodiment acts as an optical frequency converter that is supplied with an input optical beam of a first wavelength as the optical trigger and produces an output optical beam with a second wavelength.

Figure 9:
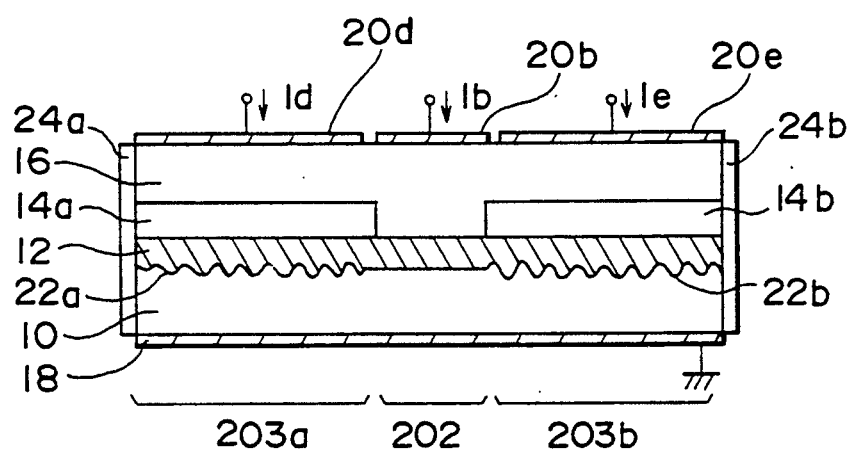
FIG. 9 is a diagram showing the structure of an active optical filter that uses the MQW waveguide according to a fourth embodiment of the present invention.

FIG. 9 shows a tunable laser amplifier according to a fourth embodiment of the present invention.

Referring to FIG. 9, the device includes two DFB regions 203a and 203b respectively formed with diffraction gratings 22a and 22b on the upper major surface of the n-type InP substrate 18, with the phase adjusting region 202 formed between the regions 203a and 203b. In correspondence to the DFB region 203a, an active layer 14a having a composition and thickness identical with the active layer 14 is provided on the MQW waveguide 12. Similarly, another active layer 14b is provided on the MQW waveguide 12 with the composition and thickness identical with the active layer 14. Further, the clad layer 16 is provided on the active layers 14a and 14b. On the upper major surface of the clad layer 16, electrodes 20d and 20e are provided respectively in correspondence to the DFB regions 203a and 203b for injection of control currents $I_d$ and $I_e$. Further, in correspondence to the phase adjusting region 202, the electrode 20b is provided for injection of the control current $I_b$. At both longitudinal ends, anti-reflection coatings 24a and 24b are provided.

In operation, the current $I_d$ and $I_a$ are set such that the device is in the condition just below the lasing threshold. When the control current $I_b$ is changed, the optical phase of the gratings 22a and 22b changed owing to the refractive index change of the MQW waveguide in correspondence to the region 202. Thereby, the laser amplifier of FIG. 9 acts as an optical filter having a variable passband wavelength.

Figure 10A:
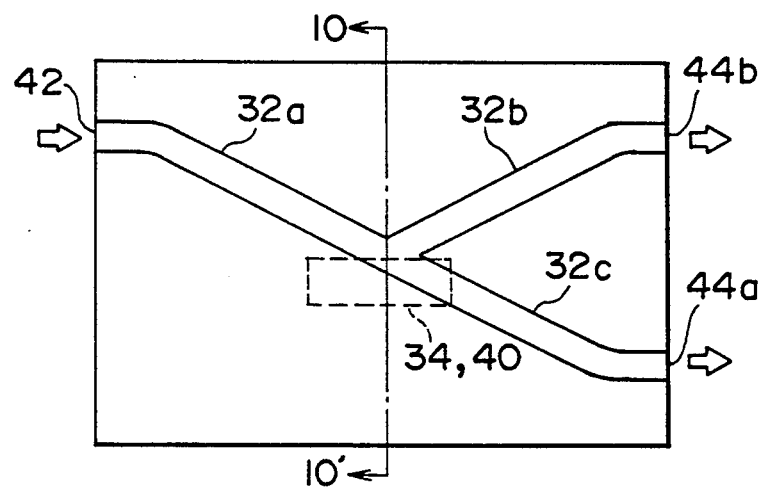
FIGS. 10(A) and 10(B) are diagrams showing an optical switch that uses the MQW waveguide according to a fifth embodiment of the present invention.
Figure 10B:
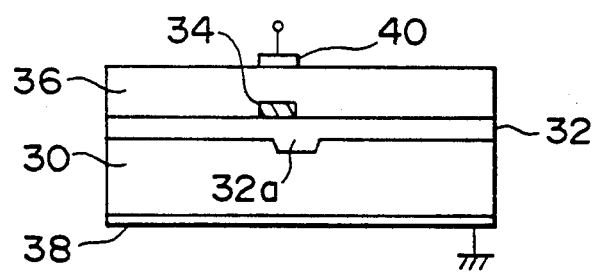

FIGS. 10(A) and 10(B) are diagrams showing an optical switch according to a fifth embodiment of the present invention, wherein FIG. 10(A) shows a plan view and FIG. 10(B) shows a cross sectional view taken along a line 10—10'.

Referring to the cross section of FIG. 10(B) at first, the device is constructed on a substrate 30 of n-type InP, and a waveguide layer 32 of n-type InGaAsP is provided on the upper major surface of the substrate 30 with a thickness of 0.3 μm. The waveguide layer 32 has a composition set such that an input optical beam given with a predetermined wavelength is guided therethrough without substantial absorption by the carriers, and has a refractive index that is larger than the refractive index of the substrate 30. When guiding the optical beam having the wavelength of 1.55 μm, the composition of the waveguide layer 32 is typically set to $In_{0.81}Ga_{0.19}As_{0.4}P_{0.6}$ in correspondence to the bandgap wavelength of 1.15 μm. The layer 32 itself does not have the MQW structure.

On the upper major surface of the substrate 30, there is provided a groove 32a as a path of the optical beam as shown in the plan view of FIG. 10(A), wherein the groove 32a extends from an optical input port 42 and is branched into a first groove 32b extending to a first optical output port 44b and a second grove 32c extending to a second optical output port 44c. It should be noted that the waveguide layer 32 fills the grooves 32a–32c and these grooves, filled by the high refractive index material, act as the channel of the optical beam.

On the upper major surface of the wave guide layer 32, there is provided a region 32 having a rectangular form to interrupt the optical path provided by the groove 32c when viewed in the plan view of FIG. 10(A). The region 34 has the MQW structure described previously with reference to FIG. 5 and hence includes the alternate stacking of the layers 1 and 2.

The MQW structure 34 is covered by a clad layer 36 of p-type InP that is grown epitaxially on the upper major surface of the waveguide layer 32. Further, an electrode 40 is provided on the upper major surface of the clad layer 36 in correspondence to the part located immediately above the MQW structure 34. Thereby, one can induce a large change of the refractive index in the MQW structure 34 by injecting a control current via the electrode 40. Of course, there is provided another electrode 38 at the lower major surface of the substrate 30 for ground connection.

When there is induced a large negative change in the refractive index as shown in FIG. 4 in the MQW structure 34 in response to the injection of the carriers, the optical beam traveling along the channel 32a interacts with the decreased refractive index when entering into the region located immediately under the MQW structure 34. Thereby, the optical beam is reflected to the second path along the optical channel 32b. When no current is injected, the optical beam passes straight through the optical channel 32c. Thus, the device of the present embodiment acts as an optical switch for switching the path of the optical beam.

Figure 11:
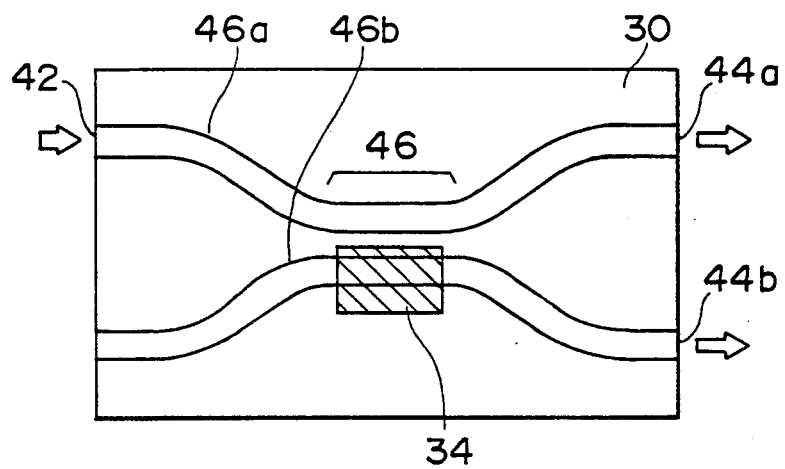
FIG. 11 is a diagram showing a directional optical coupler that uses the MQW waveguide according to a sixth embodiment of the present invention.

FIG. 11 shows a sixth embodiment of the present invention, wherein MQW structure 34 described with reference to the previous embodiment is used in a directional optical coupler. As the device of the present invention has the cross section substantially identical with the cross section of FIG. 10(B), the description thereof will be omitted.

In the embodiment, grooves 46a and 46b are formed on the upper major surface of the substrate 30 as the path of the optical beam, wherein the grooves 46a and 46b are disposed with a reduced separation in correspondence to a coupling region 46 for optical coupling, as usual in the directional optical coupler. In the present embodiment, the MQW structure 34 is provided on the optical channel 44b in correspondence to the coupling region 46, and the refractive index is changed in correspondence to the MQW structure 34 by injecting the carriers similarly to the previous embodiment.

In the present embodiment, the difference in the propagation constant between the odd mode and even mode of the optical beam is modified as a result of the refraction change in the MQW structure 34. Thereby, one can control the transfer of the optical energy and hence the optical signal between the optical channel 46a and the optical channel 46b.

Figure 12:
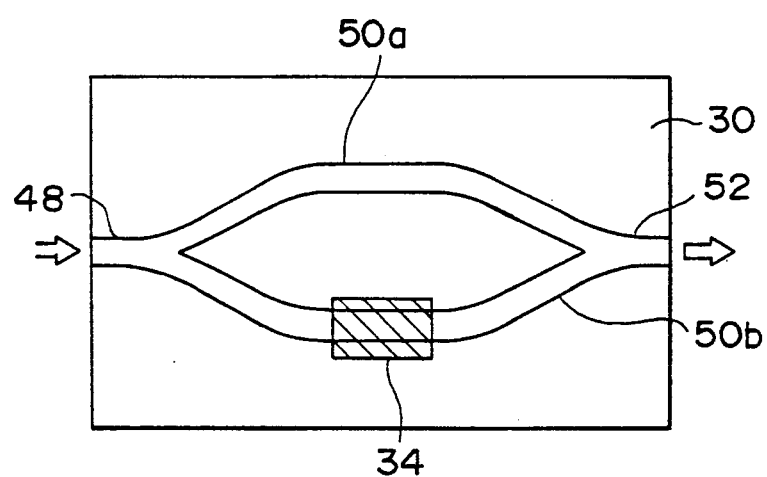
FIG. 12 is a diagram showing a Mach-Zehnder interferometer that uses the MQW waveguide according to a seventh embodiment of the present invention.

FIG. 12 shows a Mach-Zehnder interferometer according to a seventh embodiment of the present invention. As the device of FIG. 12 has a layered construction similar to the device of FIG. 10(B) or FIG. 11, the description of the cross section will be omitted.

In the device of FIG. 12, there is provided a groove 48 on the upper major surface of the substrate 30 in correspondence to an input optical channel, wherein the groove 48 is branched into a first groove 50a corresponding to a first branched optical channel and a second groove 50b corresponding to a second branched optical channel. Further, the grooves 50a and 50b merge again to form a single groove 52 corresponding to an output optical channel.

In the device of the present embodiment, the MQW structure 34 is provided on the upper major surface of the substrate 30 in correspondence to the groove 50b for causing a shift in phase of the optical beam passing through the groove 50b in response to the injection of the carriers into the quantum states formed in the MQW structure 34. In response thereto, one can control the interference of the optical beams propagating through the optical channels 50a and 50b, and the intensity of the optical beam obtained in the optical channel 52 is modulated thereby. In other words, the device of FIG. 12 acts as the optical modulator.

In any of these embodiments, it should be noted that the MQW waveguide designed with respect to the wavelength of the input optical beam in accordance with the principle explained with reference to FIG. 5, achieves a large refractive index change while minimizing the absorption caused by the band tail.

Further, the present invention is not limited to the embodiments described heretofore, but various variations and modifications may be made without departing from the scope of the invention.

What is claimed is:

1. A semiconductor optical waveguide for guiding an optical beam having a predetermined wavelength and a corresponding optical energy, comprising:
   a substrate of a semiconductor material doped to a first conductivity type and having a lattice constant, said substrate having upper and lower major surfaces;
   a multiple quantum well layer having upper and lower major surfaces and provided on the substrate, said multiple quantum well layer guiding the optical beam and comprising an alternate stacking of:
      a quantum well layer of a semiconductor material having a composition set to provide a smallest band gap that is possible under a constraint that the quantum well layer maintains a lattice matching with said substrate, said quantum well layer having a thickness set with respect to the optical energy of the optical beam such that discrete quantum levels of carriers are formed in the quantum well layer; and
      a barrier layer having a band gap substantially larger than the band gap of the quantum well layer;
   a clad layer of a semiconductor material having upper and lower major surfaces, said clad layer being doped to a second conductivity type opposite to said first conductivity type and provided on the multiple quantum well layer for confining the optical beam in the multiple quantum well layer;
   first electrode means provided on the upper major surface of the clad layer for injecting carriers of a first type into the quantum well layer, and
   second electrode means provided on the lower major surface of the substrate for injecting carriers of a second, opposite type into the quantum well layer.

2. A semiconductor optical waveguide as claimed in claim 1 in which said quantum well layer has a thickness set such that the quantum levels are formed with an energy separation that is larger than the optical energy of the input optical beam by an amount corresponding to an extension of a band tail at a lower edge of an optical absorption band.

3. A semiconductor optical waveguide as claimed in claim 1 in which said quantum well layer has a thickness set such that said separation is larger by about 50 meV as compared with the optical energy of the input optical beam.

4. A semiconductor optical waveguide as claimed in claim 1 in which said substrate is formed of InP, and said quantum well layer comprises InGaAsP having a composition represented by compositional parameters x and y as $In_xGa_{1-x}As_yP_{1-y}$, wherein the compositional parameter x is selected from a range of 0.53–1, and the compositional parameter y is selected from a range of 1–0.

5. A semiconductor optical waveguide as claimed in claim 4 in which said quantum well layer has a composition of $In_{0.53}Ga_{0.47}As$.

6. A semiconductor optical waveguide as claimed in claim 4 in which the thickness of said quantum well layer is set to a range between 4–10 nm.

7. A semiconductor optical waveguide as claimed in claim 6 in which said quantum well layer has a thickness of about 4.2 nm.

8. A semiconductor optical device for producing an optical beam with a controlled wavelength and a controlled optical energy corresponding to said controlled wavelength, comprising:
   a substrate of a semiconductor material doped to a first conductivity type and having a lattice constant, said substrate having upper and lower major surfaces;
   an active layer having upper and lower major surfaces and provided on the substrate for producing an optical beam as a result of a stimulated emission;
   an optical waveguide having upper and lower major surfaces and provided on the substrate with an optical coupling with said active layer such that the optical waveguide and the active layer can exchange optical radiation therebetween, said optical waveguide guiding therethrough the optical beam produced by the active layer and comprising an alternate stacking of:
      a quantum well layer of a semiconductor material having a composition set to provide a smallest band gap that is possible under a constraint that the quantum well layer maintains a lattice matching with said substrate, said quantum well layer having a thickness set with respect to said controlled optical energy of the optical beam such that the discrete quantum levels of carriers are formed in the quantum well layer with an energy separation that is larger than said controlled optical energy by about 50 meV; and
      a barrier layer having a band gap substantially larger than the band gap of the quantum well layer;

a clad layer of a semiconductor material having upper and lower major surfaces and doped to a second conductivity type opposite to said first conductivity type and provided on the multiple quantum well layer for confining the optical beam in said active layer and in said optical waveguide;

first electrode means provided on the upper major surface of the clad layer for injecting carriers of a first type into the quantum well layer;

second electrode means provided on the upper major surface of the clad layer for injecting carriers of the first type into the active layer; and third electrode means provided on the lower major surface of the substrate for injecting carriers of a second, opposite type into the quantum well layer.

9. A semiconductor optical device as claimed in claim 8 in which said optical waveguide further comprises reflection means for reflecting the optical beam guided through the optical waveguide back and forth for laser oscillation.

10. A semiconductor optical device as claimed in claim 9 in which said reflection means comprises mirror surfaces provided at both ends of the optical waveguide.

11. A semiconductor optical device as claimed in claim 9 in which said reflection means comprises a diffraction grating provided along the optical waveguide.

12. A semiconductor optical waveguide for guiding an optical beam having a predetermined wavelength and a predetermined optical energy corresponding to said predetermined wavelength, comprising:

a substrate of a semiconductor material having a lattice constant and a first refractive index, said substrate being doped to a first conductivity type and having upper and lower major surfaces;

a groove formed on the upper major surface of the substrate in correspondence to a path of the optical beam;

a waveguide layer of semiconductor material doped to the first conductivity type, said waveguide layer having upper and lower major surfaces and provided on the upper major surface of the substrate so as to fill the groove on the upper major surface of the substrate, said waveguide layer having a second refractive index substantially larger than the first refractive index, said waveguide layer having a band gap substantially larger than said predetermined optical energy of the optical beam;

a clad layer of a semiconductor material doped to a second, opposite conductivity type and having upper and lower major surfaces, said clad layer being provided on the waveguide layer for confining the optical beam in the waveguide layer;

a control region provided on the upper major surface of the waveguide layer in contact therewith, said control region being covered with said clad layer and comprising an alternate stacking of:

a quantum well layer of a semiconductor material having a composition set to provide a smallest band gap that is possible under a constraint that the quantum well layer maintains a lattice matching with said substrate, said quantum well layer having a thickness set with respect to said predetermined optical energy of the optical beam such that discrete quantum levels of carriers are formed in the quantum well layer with an energy separation that is larger than said predetermined optical energy by about 50 meV; and a barrier layer having a band gap substantially larger than the band gap of the quantum well layer, first electrode means provided on the upper major surface of the clad layer in correspondence to where the control region is provided, for injecting carriers of a first type to the quantum well layer of the control region; and second electrode means provided on the lower major surface of the substrate for injecting carriers of a second, opposite type to the quantum well layer of the control region.

* * * * *

UNITED STATES PATENT AND TRADEMARK OFFICE
CERTIFICATE OF CORRECTION

PATENT NO. : 5,179,615
DATED : Jan. 12, 1993
INVENTOR(S) : TANAKA et al.

It is certified that error appears in the above-indentified patent and that said Letters Patent is hereby corrected as shown below:

Col. 1, line 39, change "sell" to --well--.

* Col. 2, line 21, change "device" to --devise--.

Col. 10, line 15, change "region 32" to --region 34--.

Signed and Sealed this

Twenty-eighth Day of June, 1994

Attest:

BRUCE LEHMAN

Attesting Officer

Commissioner of Patents and Trademarks